United States Patent [19]

Menegoli et al.

[11] Patent Number: 5,477,171

[45] Date of Patent: Dec. 19, 1995

[54] FULL WAVE RECTIFIER USING CURRENT MIRROR BRIDGE

[75] Inventors: Paolo Menegoli, Milpitas, Calif.; Mark E. Rohrbaugh, Scottsdale, Ariz.

[73] Assignee: SGS-THOMSON Microelectronics, Inc., Carrollton, Tex.

[21] Appl. No.: 271,043

[22] Filed: Jul. 6, 1994

Related U.S. Application Data

[62] Division of Ser. No. 981,819, Nov. 25, 1992, Pat. No. 5,349,521.

[51] Int. Cl.⁶ ............................. H03K 5/22; G06G 7/25; H02M 7/217
[52] U.S. Cl. ..................... 327/87; 327/104; 327/184; 327/354; 363/81
[58] Field of Search ................ 363/81, 84, 89, 363/125, 127; 323/299, 315, 316; 327/87, 184, 104, 354, 303, 363

[56] References Cited

U.S. PATENT DOCUMENTS

| | | | |
|---|---|---|---|
| 4,485,348 | 11/1984 | Perkins | 363/127 |
| 4,523,105 | 6/1985 | Jose et al. | 323/315 |
| 4,571,502 | 2/1986 | Kimura et al. | 363/127 |
| 4,943,736 | 7/1990 | Kihara et al. | 323/316 |

Primary Examiner—Toan Tran
Attorney, Agent, or Firm—Richard A. Bachand; Rodney M. Anderson; Lisa K. Jorgenson

[57] ABSTRACT

A full wave rectifier includes an amplifier having a minus input, a plus input and an amplifier output; an input resistor connected between a circuit input and the minus input; and a current bridge having an output terminal connected to the circuit output, a first terminal connected to the minus input and a second terminal connected to the amplifier output. The current bridge includes a first current mirror circuit and a second current mirror circuit. The first current mirror circuit includes a first current source and a second current source, a source end of each current source of the first and second current sources being connected to the first terminal, a drain end of the first current source being connected to the second terminal and a drain end of the second current source being connected to the output terminal. The second current mirror circuit includes a third current source and fourth current source, a source end of each current source of the third and fourth current sources being connected to the second terminal, a drain end of the third current source being connected to the first terminal and a drain end of the fourth current source being connected to the output terminal.

2 Claims, 1 Drawing Sheet

FULL WAVE RECTIFIER USING CURRENT MIRROR BRIDGE

This is a division of application Ser. No. 07/981,819, now U.S. Pat. No. 5,349,521 filed Nov. 25, 1992.

BACKGROUND OF THE INVENTION

1. Field of the Invention

This invention relates to the field of full wave rectifiers. In particular, this invention relates to the field of rectifying signals with a full wave rectifier having active components.

2. Description of the Related Art

Conventionally, signals are rectified in diodes. In particular, a full wave rectifier is conventionally mechanized from a diode bridge arrangement as shown in FIG. 3. Alternatively, a full wave rectifier is conventionally mechanized using a center tapped transformer and diode pair as shown in FIG. 4. The circuit of FIG. 4 is difficult or impossible to produce in an integrated circuit, and the circuit of FIG. 3 requires considerable silicon area to integrate and is slow due to high intrinsic parasitic capacities of the diodes.

SUMMARY OF THE INVENTION

It is an object of the present invention to provide a full wave rectifier that requires less surface area in an integrated circuit application than conventional rectifiers. It is yet another object of the present invention to provide a full wave rectifier capable of higher precision and speed than conventional rectifiers.

These and other objects are achieved in a full wave rectifier including an amplifier having a minus input, a plus input and an amplifier output; an input resistor connected between a circuit input and the minus input; and a current bridge having an output terminal connected to the circuit output, a first terminal connected to the minus input and a second terminal connected to the amplifier output, the circuit output driving an output load. The current bridge includes a first current mirror circuit and a second current mirror circuit.

These and other objects are achieved in a feedback circuit of a full wave rectifier including a first current mirror circuit connected to an amplifier input and a second current mirror circuit connected to an amplifier output.

These and other objects are achieved with a method for rectifying a signal current applied to a circuit input terminal to provide a rectified signal current at a circuit output of a circuit having a circuit output terminal. Considering positive, when the signal current into the circuit input terminal is greater than zero, the method passes a first portion of the signal current from the circuit input terminal to the circuit output terminal and passes a second portion of the signal current from the circuit input terminal to the circuit output, the signal current passing into the circuit input terminal being substantially equal to the sum of the first and second portions of the signal current. Considering negative when the signal current into the circuit input terminal is less than zero, the method passes the signal current from the circuit output terminal to the circuit input terminal while producing a mirrored current passing from the circuit output terminal to the circuit output, the mirror current being substantially equal to one-half of the signal current.

BRIEF DESCRIPTION OF THE DRAWINGS

The invention will be described in detail in the following description of preferred embodiments with reference to the following figures.

DESCRIPTION OF PREFERRED EMBODIMENTS

Figure 1:
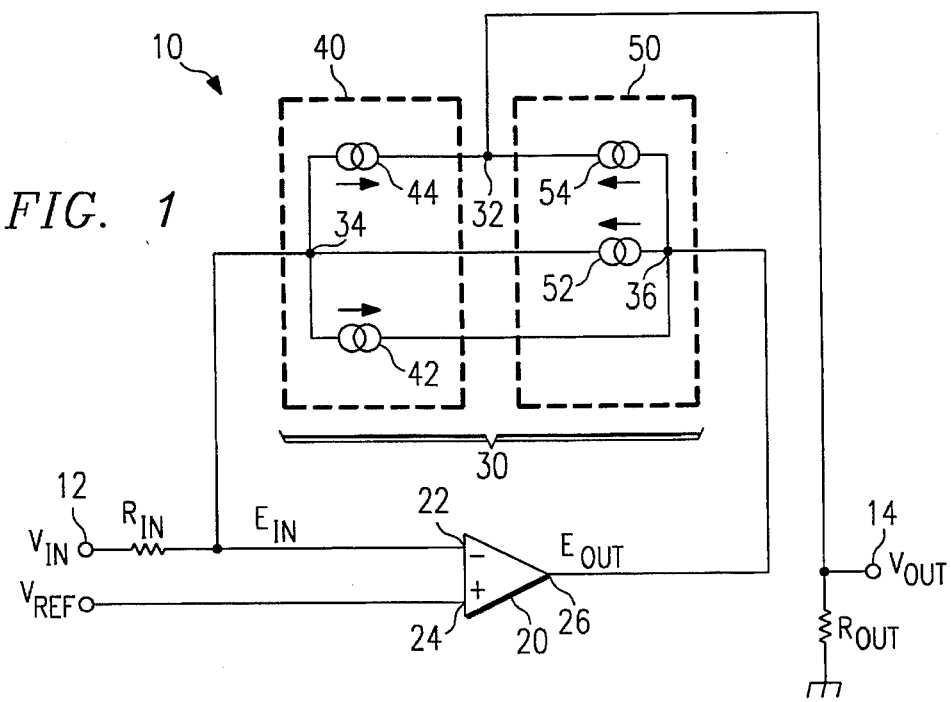
FIG. 1 is a functional schematic of an embodiment of the invention.

In FIG. 1, full wave rectifier 10 includes amplifier 20, input resistor $R_{IN}$ and current bridge 30. Current bridge 30 includes first current mirror circuit 40 and second current mirror circuit 50. Current bridge 30 has output terminal 32, first terminal 34 and second terminal 36, terminals 34, 36 being connected to the amplifier. Amplifier 20, preferably an amplifier of the type referred to as an operational amplifier, has minus input 22 connected to first terminal 34, plus input 24 connected to a voltage reference $V_{REF}$, and amplifier output 26 connected to second terminal 36. Full wave rectifier 10 has circuit input 12 connected to minus input 22 through input resistor $R_{IN}$ and circuit output 14 connected to output terminal 32.

In operation, amplifier input voltage $E_{IN}$ at minus input 22 will remain at a voltage very nearly equal to reference voltage $V_{REF}$ connected to plus input 24 of amplifier 20. This is a basic feature of an operational amplifier where small voltage differences between minus input 22 and plus input 24 are amplified to become a large output signal $E_{OUT}$ at amplifier output 26, and the feedback circuit provides negative feedback to control the amplifier input voltage $E_{IN}$ to be very nearly equal to the reference voltage $V_{REF}$. Thus, a signal current will flow from circuit input 12 to minus input 22 (i.e., the amplifier input) which is proportional to the voltage difference $V_{IN}-E_{IN}$ which may be closely approximated by $V_{IN}-V_{REF}$. Substantially all of this current passes through the current bridge 30 since another characteristic of operational amplifiers is a high input impedance so very little current passes into or out of minus input 22.

When $V_{IN}$ is greater than $V_{REF}$, the signal current passes from circuit input 12 through input resistor $R_{IN}$ to minus input 22 and then on to first terminal 34. From there a first portion of the signal current passes through first current source 42 from a source end to a drain end and on to second terminal 36 and from there on to amplifier output 26. Meanwhile a second portion of the signal current passes through second current source 44 from a source end to a drain end to output terminal 32 and from there on to circuit output 14. First current mirror circuit 40 is preferably designed so that the amount of current passing through second current source 44 is controlled to be equal to the current passing through first current source 42. Therefore, the signal current passing into first terminal 34 is divided equally so that one half passes through each of the first and second current sources 42, 44. It will be appreciated that other proportions of current division may be used as well.

When signal voltage $V_{IN}$ is less than reference voltage $V_{REF}$, a signal current characterized by the voltage drop across input resistor $R_{IN}$ is sourced at amplifier output 26 and is passed to second terminal 36, passing through third current source 52 from a source end to a drain end to first terminal 34 and from there on to minus input 22, through input resistor $R_{IN}$ and to circuit input 12. Second current mirror circuit 50 is preferably designed so that a current passing through third current source 52 controls a mirror current passing through fourth current source 54 from a source end to a drain end to be one half of the current passing through third current source 52. It will be appreciated that the current passing through fourth current source 54 may be another proportion of the current passing through third current source 52 so long as the mirror current passing through fourth current source 54 responsive to the signal current is the same proportion relative to the signal current as the current passing through second current source 44 relative to the signal current. The current passing through fourth current source 54 passes to output terminal 32 and from there to circuit output 14.

Figure 2:
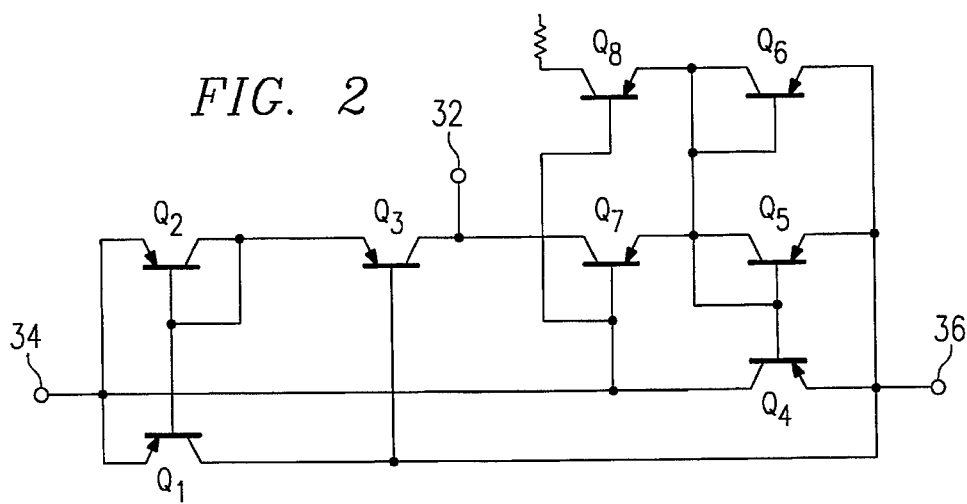
FIG. 2 is a circuit schematic of an embodiment of the invention.
Figure 3:
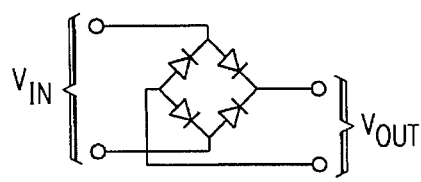
FIG. 3 is a circuit schematic of a conventional diode bridge rectifier.
Figure 4:
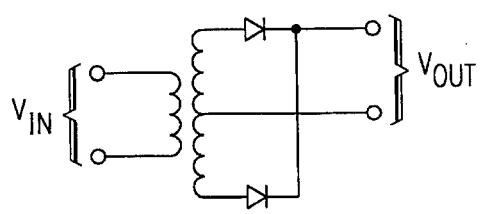
FIG. 4 is a circuit schematic of a conventional center tapped transformer full wave rectifier.

FIG. 2 is an embodiment of current bridge 30 (i.e., a feedback circuit). The first current mirror circuit is represented by transistors Q1 through Q3 and the second current mirror circuit is represented by transistors Q4 through Q8. The circuit input terminal 34 is the first terminal 34 of FIG. 1, the circuit output terminal 36 is the second terminal 36 of FIG. 1 and the circuit output 32 is the output terminal 32 of FIG. 1. When the voltage at circuit input terminal 34 is greater than the voltage at circuit output terminal 36, current flows through Q2 and through the emitter base junction of Q3 to the circuit output terminal 36. Due to the symmetrical balance between transistors Q1 and Q2, both transistors preferably pass a portion of the signal current in equal amounts (or in a predetermined ratio of different amounts) through the transistors from the emitter to the collector. Thus one half of the signal current passes from circuit input terminal 34 through transistor Q1 to circuit output terminal 36, while the other half of the signal current passes from circuit input terminal 34 through transistor Q2, through transistor Q3 from emitter to collector to circuit output 32.

On the other hand when the voltage at circuit output terminal 36 is greater than the voltage at circuit input terminal 34 a signal current passes through transistor Q4 from emitter to collector to circuit input terminal 34. The second current mirror circuit is preferably designed such that the current passing from circuit output terminal 36 through transistor Q5 from emitter to collector and from there through transistor Q7 from emitter to collector and from there to circuit output 32 is one half of the signal current passing through transistor Q4 from emitter to collector. Transistor Q6 is parallel with transistor Q5 and transistor Q8 is parallel with transistor Q7 (except fort he collector of transistor QS) so that the signal current passing through transistor Q4 will be twice that of the mirror current passing through transistors Q5 and Q7.

It will be appreciated that when $V_{IN}$ is greater than $V_{REF}$ then:

$$V_{OUT}/R_{OUT}=(V_{IN}-V_{REF})/(2\ R_{IN}). \quad (1)$$

It will also be appreciated when $V_{REF}$ is greater than $V_{IN}$ then:

$$V_{OUT}/R_{OUT}=(V_{REF}-V_{IN})/(2R_{IN}). \quad (2)$$

Therefore, a full wave rectified signal is produced corresponding to the input signal. The described rectifier operates with higher precision and speed than conventional rectifiers since the current mirrors employ transistors which do not saturate because of having direct base drive. In addition, fewer components are required in the present invention than used with comparable techniques.

Having described the preferred embodiments of a novel full wave rectifier, feedback circuit and method for rectifying a signal (which are intended to be illustrative and not limiting), it is noted that modifications and variations can be made by those skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the following claims.

1. A feedback circuit having a circuit output for driving an output load, and being connected between an amplifier input and an amplifier output, comprising:

a first current mirror circuit having a first current source and a second current source, a source end of each of the first and second current sources being connected to the amplifier input, a drain end of the first current source being connected to the amplifier output, and a drain end of the second current source being connected to the circuit output; and a second current mirror circuit having a third current source and a fourth current source, a source end of each of the third and fourth current sources being connected to the amplifier output, a drain end of the third current source being connected to the amplifier input, and a drain end of the fourth current source being connected to the circuit output.

2. The feedback circuit of claim 1, wherein:

the first current mirror circuit controls a current passing through the second current source to be substantially equal to a current passing through the first current source; and the second current mirror circuit controls a current passing through the fourth current source to be substantially equal to one-half of a current passing through the third current source.

\* \* \* \* \*